(12) United States Patent
Baker et al.

(10) Patent No.: US 11,069,855 B2
(45) Date of Patent: Jul. 20, 2021

(54) DIELECTRIC BARRIER AT NON-VOLATILE MEMORY TILE EDGE

(71) Applicant: Intel Corporation, Santa Clara, CA (US)

(72) Inventors: Kevin L. Baker, Boise, ID (US);
Robert K. Grubbs, Boise, ID (US);
Farrell M. Good, Meridian, ID (US);
Ervin T. Hill, Boise, ID (US);
Bhumika Chhabra, Boise, ID (US);
Jay S. Brown, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/459,419

(22) Filed: Jul. 1, 2019

(65) Prior Publication Data

US 2021/0005810 A1    Jan. 7, 2021

(51) Int. Cl.
*H01L 47/00* (2006.01)
*H01L 45/00* (2006.01)
*H01L 27/24* (2006.01)

(52) U.S. Cl.
CPC ...... *H01L 45/1233* (2013.01); *H01L 27/2481* (2013.01); *H01L 45/06* (2013.01); *H01L 45/144* (2013.01); *H01L 45/1683* (2013.01)

(58) Field of Classification Search
CPC ... H01L 45/1233; H01L 45/06; H01L 45/144; H01L 45/1683; H01L 27/2481
See application file for complete search history.

(56) References Cited

U.S. PATENT DOCUMENTS

| | | | |
|---|---|---|---|
| 2011/0133151 A1 | 6/2011 | Li et al. | |
| 2012/0241705 A1* | 9/2012 | Bresolin | H01L 45/16 257/2 |
| 2014/0158975 A1 | 6/2014 | Herner | |
| 2015/0155483 A1* | 6/2015 | Greene | H01L 27/2436 257/5 |
| 2017/0243923 A1 | 8/2017 | Jeong et al. | |
| 2018/0286921 A1 | 10/2018 | Redaelli et al. | |
| 2019/0088873 A1* | 3/2019 | Fantini | H01L 45/1608 |

FOREIGN PATENT DOCUMENTS

WO    2017048596 A1    3/2017

OTHER PUBLICATIONS

Extended European Search Report for Patent Application No. EP20164426, dated Dec. 2, 2020, 6 pages.

* cited by examiner

*Primary Examiner* — Long K Tran
(74) *Attorney, Agent, or Firm* — Compass IP Law, PC

(57) ABSTRACT

An oxidation barrier for non-volatile memory with materials sensitive to temperature and/or cross contamination (e.g., chalcogenide materials) are described The barrier can be formed, for example, around the boundaries of a non-volatile memory tile (also known as a block or sub-array). For example, a non-volatile memory device can include an oxidation barrier on a side wall of a trench between adjacent memory tiles.

20 Claims, 8 Drawing Sheets

DIELECTRIC BARRIER AT NON-VOLATILE MEMORY TILE EDGE

FIELD

The descriptions are generally related to non-volatile memory, and more particularly, to an oxidation and moisture barrier for non-volatile memory.

BACKGROUND

Memory resources have innumerable applications in electronic devices and other computing environments. There is demand for memory technologies that can scale smaller than traditional memory devices. Newer memory technologies typically include smaller and/or vertically stacked memory cells to achieve a higher memory capacity per area. However, such memory technologies pose many challenges in the process space due to, for example, high aspect ratio trenches, small feature sizes, or temperature-sensitive materials.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

A dielectric barrier/sealing layer for memory devices is described.

Manufacturing memory devices involves the deposition and etch of a number of materials. Some deposition and etch processes can cause unwanted changes in the materials that may affect operation of the final device. For example, definition of memory tiles or sub-arrays on a die involves etching through the array materials. Conventional memory that includes chalcogenide materials may be susceptible to damage and cross contamination of the chalcogenide materials during and post-etch. In contrast to conventional memory devices, an oxidation barrier is formed around the boundaries of a non-volatile memory tile, which can protect the tile edges from contaminants.

Figure 1:
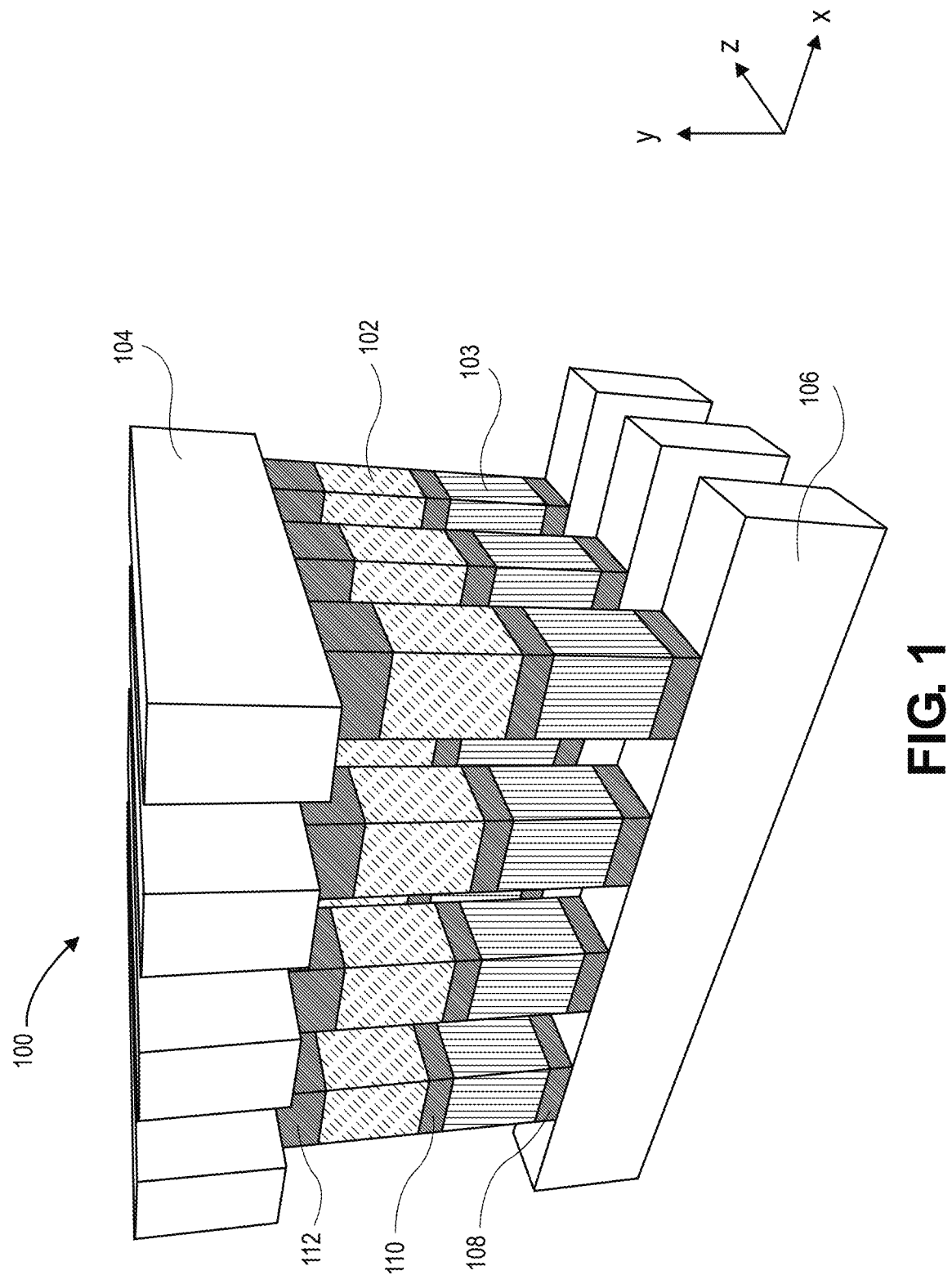
FIG. 1 illustrates an example of a portion of a memory cell array.

FIG. 1 illustrates a portion of a memory cell array 100 that may include a dielectric barrier. The memory cell array 100 is an example of a three-dimensional (3D) cross-point memory structure. A typical 3D cross-point device includes a stack of materials including a storage material and conductive layers, which are patterned to form an array of memory cells with conductive access lines (e.g., wordlines and bitlines). The wordlines and bitlines are typically patterned so that the wordlines are orthogonal to the bitlines, creating a grid pattern or "cross-points." A cross-point is an intersection between a bitline, a wordline, and active material(s) (e.g., the selector and/or storage material). A memory cell is located at the intersection of a bitline and a wordline.

Referring to FIG. 1, the memory cell array 100 includes a plurality of access lines 104, 106 to couple the memory cells with access circuitry. The access lines 104, 106 can be referred to as the bitlines and wordlines. In the example illustrated in FIG. 1, the bitlines (e.g., access lines 104) are orthogonal to the wordlines (e.g., access lines 106). The illustrated example includes chalcogenide elements 102 and 103 between the access lines 104, 106. The chalcogenide elements 102 and 103 can be that can be storage and/or selector elements. Thus, a memory cell is created from one or more chalcogenide elements 102 and 103 between the bitline and wordline where the bitline and wordline intersect. The chalcogenide elements 102 and/or 103 can be formed from a phase change material. In one example, the chalcogenide material can include $Ge_xSb_yTe_z$ (referred to as germanium-antimony-tellurium or GST), or another suitable chalcogenide material. In one example, the chalcogenide material forming a selector includes a chalcogenide glass. In other examples, a single material that has both memory and selection properties (a "self-selecting" material) can be used instead. For example, in one embodiment, a chalcogenide material can act as both a selector and a storage element without requiring separate storage and selector layers.

Referring again to the access lines 104, 106, in one example, the wordline is for accessing a particular word in a memory array and the bitline is for accessing a particular bit in the word. The access lines 104, 106 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In the example illustrated in FIG. 1, the memory array 100 includes conductive electrodes 108, 110 and 112. The conductive electrodes 112 are between the access line 104 and the storage material 102, and can be referred to as "top electrodes." The conductive electrodes 110 are between the storage material 102 and the selector material 103, and can be referred to as "middle electrodes." The electrodes 108 are between the selector material 103 and the access line 106, and can be referred to as "bottom electrodes." The terms "top," "middle," or "bottom" are used for ease of reference; different labels could be used (e.g., the electrodes 108 could be referred to as "top" electrodes, and the electrodes 112 could be referred to as "bottom" electrodes). Electrodes 108, 110, and 112 can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials.

Although a single level or layer of memory cells is shown in FIG. 1, memory cell array 100 can include multiple levels or tiers of memory cells (e.g., in the y-direction).

As mentioned briefly above, in the manufacturing process a substrate undergoes multiple deposition and etch operations. The substrate is etched to define bitlines and wordlines and to define areas for pass through vias. In one example, a "chop etch" or "alligator etch" may also be performed to define groups or tiles of memory cells. A tile is an area on the die including memory cells. Typically, a die includes multiple tiles. In one example, a tile includes tens of thousands of memory cells. A tile may alternatively be referred to as a block or a sub-array.

Figure 2:
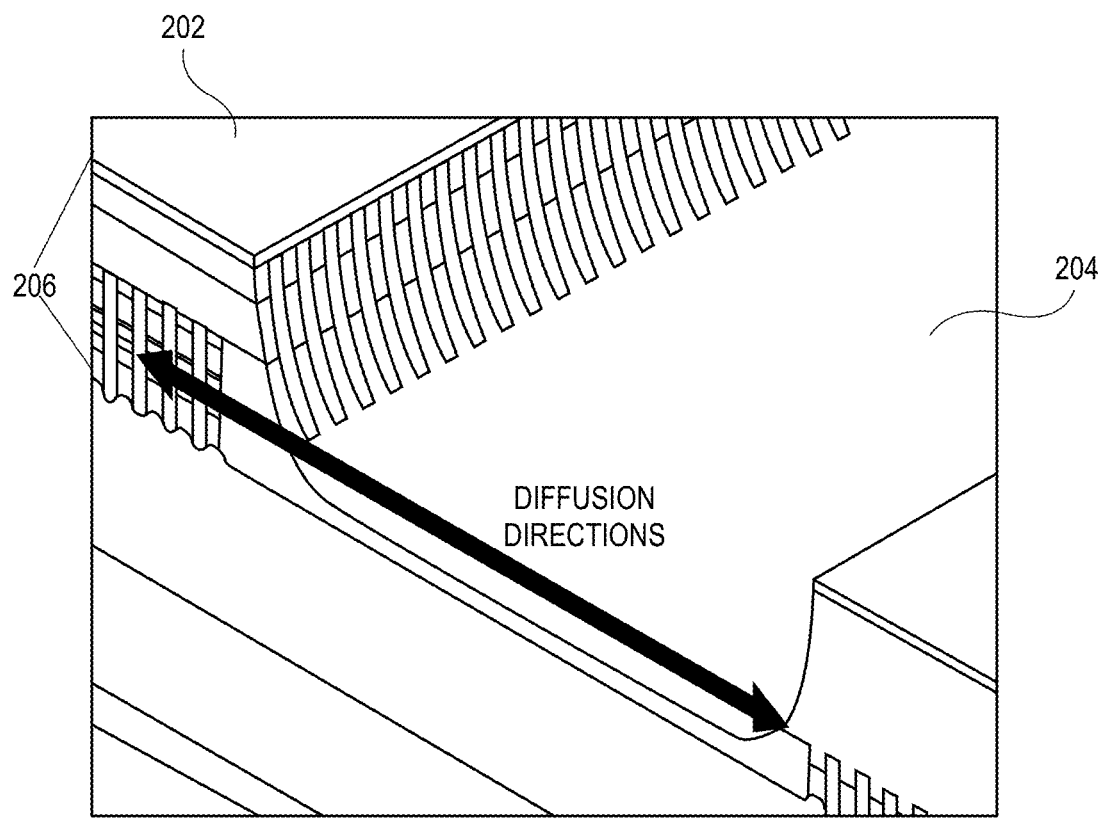
FIG. 2 illustrates an example of a substrate after a chop etch to define a memory tile.

In one example, defining the tile involves etching through the array materials. The etch process used depends on the materials to be etched and the desired etch feature. FIG. 2 illustrates an example of a substrate after a chop etch to define a section of memory cells/array elements (e.g., to define a tile 202). In one example, a chop etch involves a dry etch with non-selective chemistry to etch through the stack 206 of materials making up the array. For example, the chop etch may involve etching through conductive access lines, electrodes, and chalcogenide materials (e.g., layers making up the storage elements and/or selector devices) to form a trench 204. The trench formed by the chop etch is typically a wide/broad trench (e.g., a trench having a relatively low aspect ratio). The trench may define one or more memory tiles. In one example, a trench is etched to define two adjacent memory tiles. In an example with multiple tiers, the trench may extend through the multiple tiers between adjacent memory tiles. In one such example, the same trench may separate adjacent memory tiles in more than one tier. Because the trench is etched through the array, materials including chalcogenide material and carbon may be exposed at the side walls of the trench.

Contamination may happen during or after the etch, especially in the chalcogenide materials making up the storage element and/or selector, which tend to be sensitive to cross contamination. For example, once etched, the chalcogenide materials are liberated and exposed to allow surface migration and eventual diffusion downstream. The electrodes may also be formed from materials sensitive to cross contamination (e.g., carbon). Sources of contamination may include contamination from a carbon spin-on dielectric fill material, Se, Te, Ge, In, Sb, Hz, $H_2O$, and $O_2$.

Conventional sealing layers (such as oxide) provide insufficient protection from contamination, diffusion, and migration for memory arrays with materials such as chalcogenide materials. For example, oxides typically do not perform as an oxidation or moisture barrier. In contrast to existing memory devices, a memory device including a nitride sealing layer around edges of the memory tiles can act as a barrier against oxidation and moisture. In one example, a low temperature nitride film may be used to encapsulate the edge of a tile against contamination. With the oxidation barrier described herein, the yield and cell performance of previously affected cells are consistent with the cells whose performance was not impacted by contamination or damage. Although the example illustrated in FIGS. 1 and 2 refers to a 3D crosspoint memory array, the oxidation barrier described herein may be used for other memory technologies including chalcogenide materials or other temperature and/or contamination sensitive materials.

Figure 3:
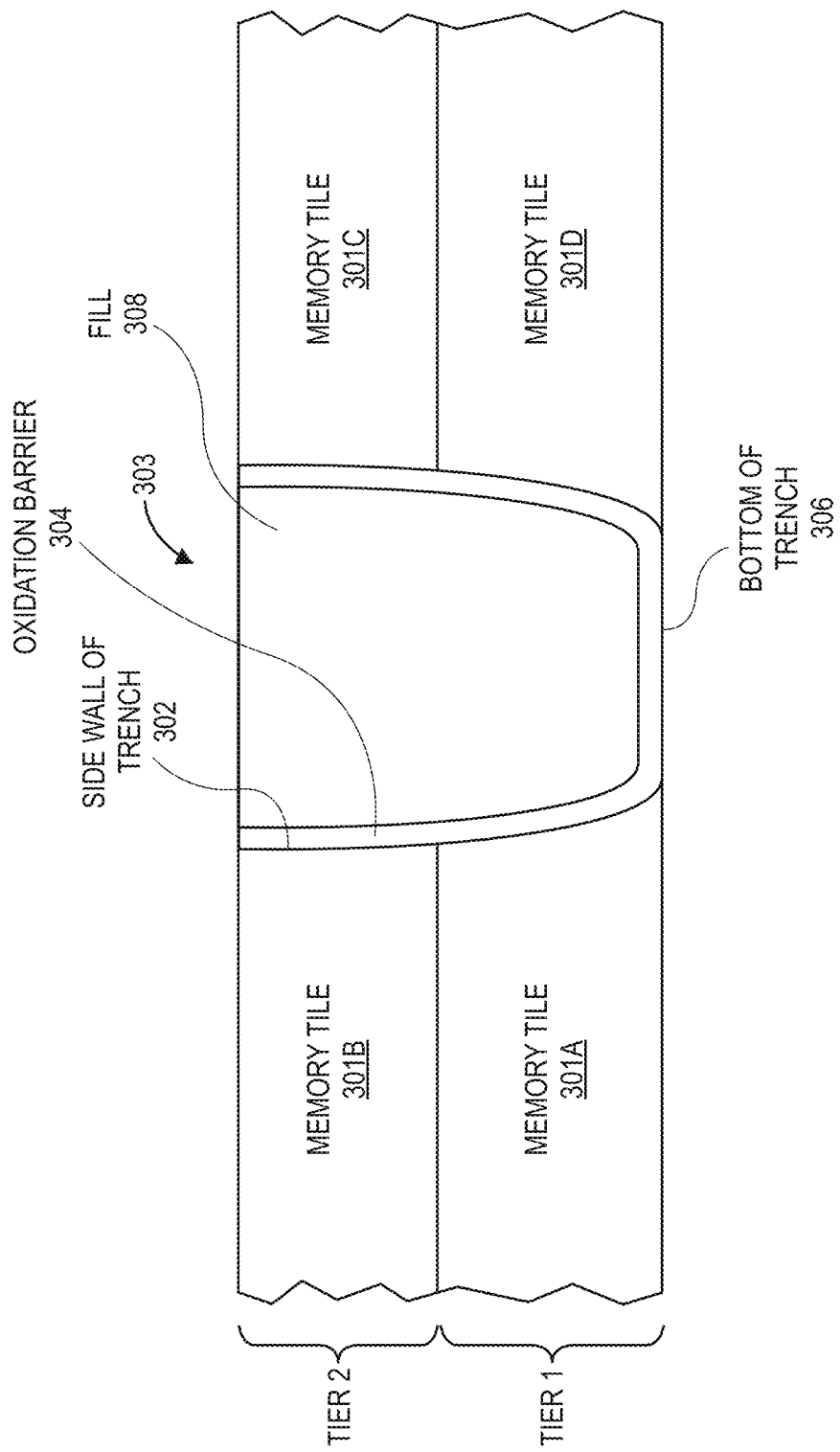
FIG. 3 illustrates an example of a cross-section of a non-volatile memory device with an oxidation barrier between adjacent memory tiles.

FIG. 3 illustrates an example of a cross-section of a non-volatile memory device with an oxidation barrier between adjacent memory tiles.

The non-volatile memory device of FIG. 3 includes multiple tiers of memory tiles: tier 1 and tier 2. The multiple tiers are vertically stacked over one another. Other examples may include a single tier or more than two tiers. Each tier includes multiple tiles, and each tile includes a plurality of non-volatile memory cells. In the illustrated example, tier 1 is shown as including memory tiles 301A and 301D. Tier 2 includes memory tiles 301B and 301C. In one example, the tiles 301A-301D are sub-arrays of 3D crosspoint memory cells.

The memory tiles are separated by a trench 303. The trench is between the memory tiles 301A and 301D, and also between the memory tiles 301B and 301C. Thus, in the illustrated example, the trench 303 extends through two tiers, however, other examples may include a trench in one tier or through more than two tiers. In one example, the trench defines a boundary of the tiles 301-301D. Similar trenches may be etched at other locations to define the other boundaries of the tiles. The tiles may have rectangular or non-rectangular boundaries when viewed from the top down. In the illustrated example, the side walls 302 of the trench 303 are tapered or angled so that the top of the trench is wider than the bottom 306 of the trench. However, other examples may have non-tapered (straight) side walls. In the illustrated example, the trench 303 that separates adjacent memory tiles is a wide trench with a relatively low aspect ratio (as opposed to a deep narrow trench). Although not shown in FIG. 3, the width of the trench may be greater than the height of the trench (e.g., the trench may be wider than it is deep).

Unlike in conventional memory devices, an oxidation barrier 304 is on the side walls 302 of the trench 303. Thus, the oxidation barrier 304 can be disposed on materials exposed at the side walls of the trench, such as a chalcogenide material, carbon, or other array materials. In one example, the oxidation barrier 304 protects the materials in the memory tiles from oxidation and moisture. In the illustrated example, the oxidation barrier 304 is a conformal layer over the tapered side walls 302 of the trench. In one example, the oxidation barrier 304 includes a silicon nitride film. Unlike typical oxide sealing layers, a nitride film can provide an effective barrier against oxidation and moisture. In one example, the nitride film is a dense nitride film. In one example, the silicon nitride film has a density that is greater than 2.6 g/cm³. In one example, the oxidation barrier has a thickness in a range between 15-500 Angstroms, although other barriers may be thinner or thicker than this range.

The oxidation barrier 304 may be formed from a single film or multiple films. In one example, the oxidation barrier 304 is formed from multiple films. In one such example, the oxidation barrier includes multiple nitride films including a first nitride film and one or more second nitride films over the first nitride film. In one such example, the first nitride film is thicker than the one or more second nitride films. In another example, the nitride films may have the same thickness. One or more films making up the oxidation barrier 304 may be plasma treated.

In the illustrated example, a dielectric fill 308 is in the trench 303 between the oxidation barrier 304 on the side walls 302 of the trench 303. In one example, the dielectric fill 308 includes an oxide or other suitable dielectric. The dielectric fill 308 can provide structural support and further insulate adjacent tiles from one another.

Figure 4:
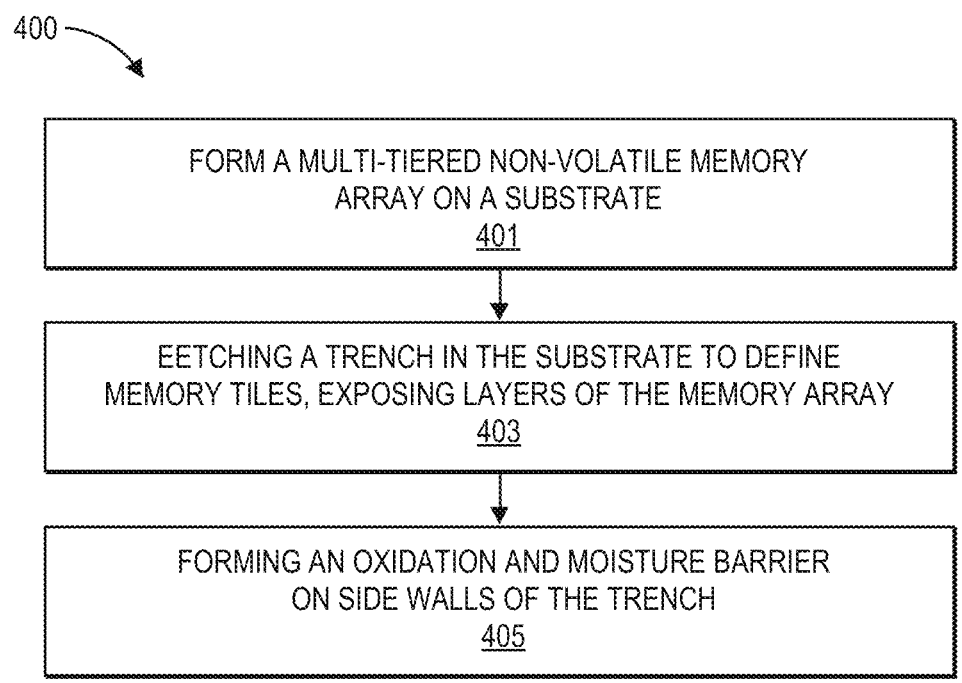
FIG. 4 is a flow diagram of an example of a method for forming an oxidation barrier during manufacture of a non-volatile memory device.

FIG. 4 is a flow diagram of an example of a method 400 for forming an oxidation barrier around tile boundaries during manufacture of a non-volatile memory device.

The method 400 begins with forming a multi-tiered non-volatile memory array on a substrate, at 401. In one example, the substrate includes CMOS control circuitry for control of the memory array and the array is built over the CMOS. In other examples, control circuitry may be located next to the array.

Forming the memory array involves depositing and patterning multiple layers of material. In one example, forming the array involves forming a 3D crosspoint array with multiple tiers. In one such example, the array includes a stack of materials that are the same as or similar to the materials in the array 100 of FIG. 1. For example, forming the memory array may involve forming conductive layers for the wordlines, bitlines, and electrodes. Processing equipment can employ any suitable process for forming the conductive layers for the wordlines and electrodes, such as electroplating, physical vapor deposition (PVD), chemical vapor deposition, or other process for forming conductive layers. The electrodes and access lines can be patterned with processing steps including lithography and etching. In one example, processing equipment employs a multiple patterning process, such as self-aligned double patterning (SADP) or other multiple patterning process, or any other suitable process may be used to form of the wordlines, bitlines, and electrodes. Forming the storage and/or selector layers may involve physical vapor deposition (PVD) or another deposition process.

Referring again to FIG. 4, after formation of the array, the method involves etching a trench in the substrate, at 403. In one example, the trench defines one or more memory tiles, such as the trench 303 of FIG. 3 to define the tiles 301A-301D. In one example, the etch is a dry etch through multiple layers of the array to define the tiles. Etching the trench may involve etching a wide shallow trench or etching a deep narrow trench. In one example, the etch exposes layers of the memory array, including chalcogenide material and electrode material. The substrate may then be cleaned post-etch and prior to sealing.

After etch, an oxidation and moisture barrier is formed on side walls of the trench, at 405. In one example, the deposition of the nitride film is performed at a low temperature. In one example, a low temperature plasma process is used to deposit a silicon nitride film. In one example, the deposition temperature is less than the glass transition temperature of the chalcogenide materials used in the array (e.g., less than the glass transition temperature of the storage and/or selector material used in the array). In one example, forming the nitride film involves deposition at a temperature in a range of 200-500° C. In one example, the deposition temperature is less than or equal to 280° C. One or more additional films may be deposited to form the oxidation barrier. One or more films may be treated. In one example, the film is formed via a plasma formed with a low power regime (e.g., less than 100 W RF power). The low power, low temperature deposition can enable formation of the oxidation barrier with minimal or no damage to sensitive materials in the memory array.

Figure 5A:
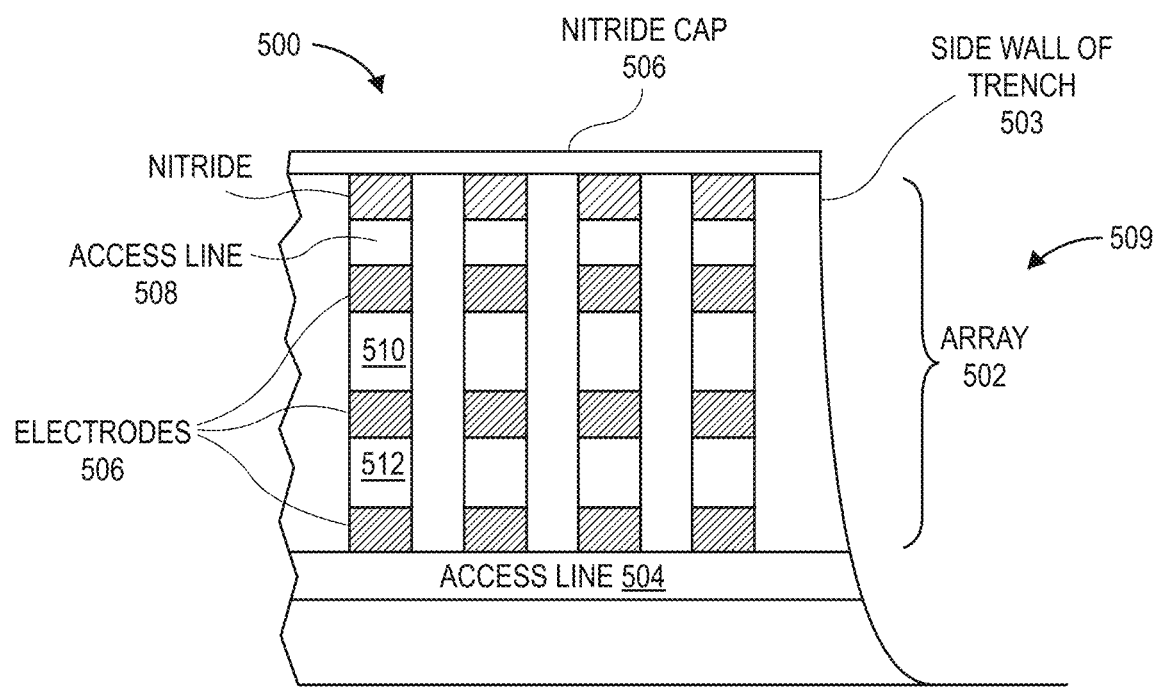
FIGS. 5A and 5B illustrate cross-sections of an example of a substrate undergoing processing to form an oxidation barrier on a tile edge.
Figure 5B:
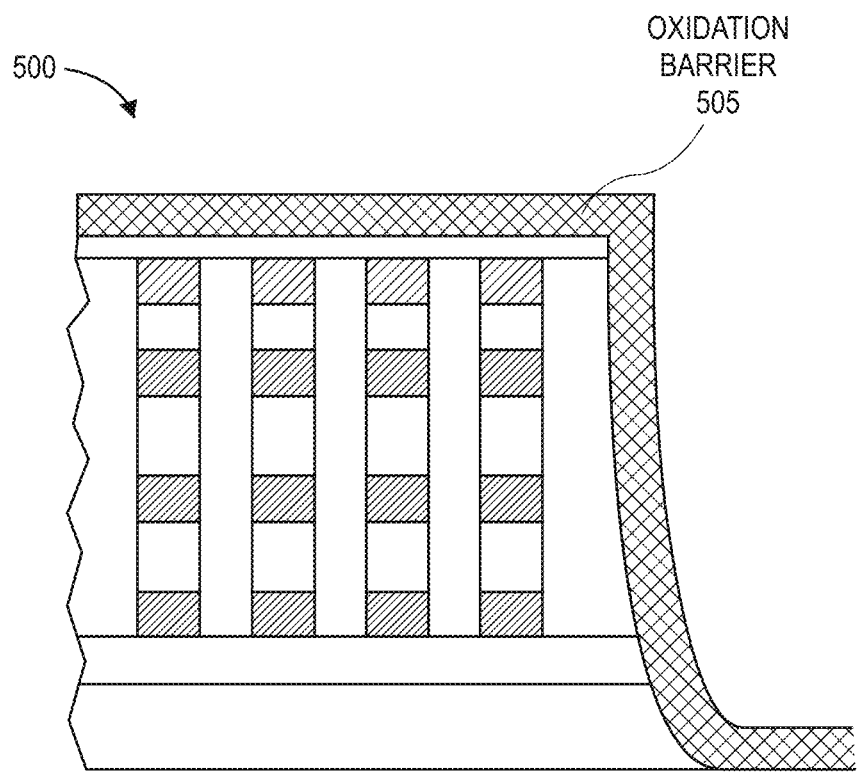

FIGS. 5A-5B illustrate cross-sections of an example of a substrate undergoing processing to form an oxidation barrier on tile edges.

FIG. 5A illustrates a cross-section of a portion of a substrate 500 including a memory array 502. The memory array 502 includes multiple patterned layers of material, including a layer of chalcogenide storage material 510, a layer of chalcogenide selector material 512, conductive electrode layers 506, and conductive access lines 504, 508. The array 502 may be the same as, or similar to, the array 100 of FIG. 1. FIG. 5A illustrates the substrate 500 after an etch (e.g., chop etch) through the array materials to form a trench 509 with side wall 503. Materials of the array 502 are exposed at the side wall 503 by the etch. For example, chalcogenide materials and/or carbon-containing materials may be exposed at the side wall 503, making those materials susceptible to damage or contamination.

Figure 5B illustrates the substrate 500 after deposition of an oxidation barrier 505. The oxidation barrier 505 may be a silicon nitride layer deposited in accordance with a method such as the method 400 of FIG. 4. In the case of the chop etch to define memory tiles, the feature size may be relatively large, leading to high conformality of the nitride layer in the trench. However, the silicon nitride film described herein may also be deposited in or over smaller features. In other examples in which the film is deposited over or in a smaller feature (e.g., a trench with a high aspect ratio), the film may have lower conformality. For example, formation of a film via a CVD process over or in small features may result in "breadloafing" in which one side has lower coverage, especially near the bottom of side walls of deep, narrow trenches. However, even for smaller feature sizes, the process described herein may still achieve sufficient conformality to act as an effective barrier.

Referring again to FIG. 5B, the oxidation barrier 505 over tile edges can protect the tiles from oxidation and thus protect against degradation of memory cell operation. The resulting silicon nitride layer deposited against the chop edge has adhesion improvement against the carbon electrodes relative to conventional dielectric films. The resulting silicon nitride layer also provides a better oxidation barrier against $O_3$ and $O_2$ plasmas and provides a better diffusion barrier to fill materials next to and above the chop region, which can be sources of —OH. By acting as an effective barrier, the silicon nitride film reduces the impact of damage and contamination on cell properties such as: reset current (Ireset, the current for programming a cell to a reset state), thermal disturb (unintentional heat flow from a cell being programmed to a neighboring cell), set Vt (threshold voltage to program a cell to a "set" state), set sigma (the width of distribution of set voltages across the measured cells), reset Vt (threshold voltage to program a cell to a "reset" state), Reset sigma (the width of distribution of reset voltages across the measured cells), Vt window (the voltage difference between reset and set voltage values), E1, E2, E3, E4 nonlinearities, (the deviation of the rising and falling edge of the set (E1 and E2) and reset (E3 and E4) distributions from a gaussian functional form, Tnuc (temperature where nucleation occurs), Vt turnaround, (the cycle number where the Vt window voltage stops decreasing and reverses direction and starts increasing in voltage), and endurance cycling (the cells are written and read and rewritten and reread to determine the longevity of the memory cell).

Thus, an oxidation barrier can be formed at a low temperature and with high quality and good adhesion to form a better barrier against cross-contamination for improved array operation. After formation of the oxidation barrier, a fill material may be deposited in the trench over the oxidation barrier 505. The oxidation barrier at the top of the tile may be removed via an etch process.

Figure 6:
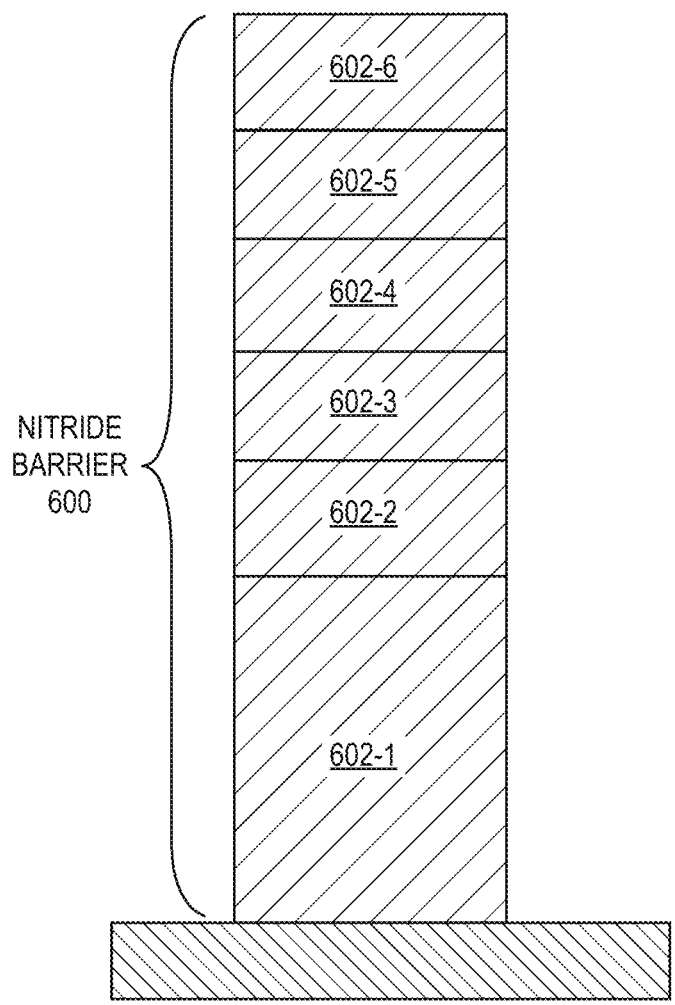
FIG. 6 illustrates an example of an oxidation barrier formed by depositing and treating multiple nitride films.

FIG. 6 illustrates an example of an oxidation barrier formed from multiple nitride films. For example, the oxidation barrier 600 involves depositing films 602-1-602-6. One or more of the films 602-1-602-6 may be treated. The example oxidation barrier 600 in FIG. 6 includes six nitride layers or films 602-1-602-6. Although the layers 602-1-602-6 are shown as discrete layers in FIG. 6, the final oxidation barrier 600 may appear as a homogenous layer. However, it may be possible to see the interfaces between adjacent films 602-1-602-6. In the illustrated example, the first nitride layer 602-1 is thicker than subsequent nitride layers 602-2-602-6. In other examples, the layers 602-1-602-6 may be the same or different thicknesses. Making the "bottom" or first layer thicker than subsequent layers may enable achieving the desired barrier thickness and quality with fewer deposition and treatment steps. Thus, the illustrated example includes a first thicker film (e.g., 50-100 Angstroms) and five thinner films (e.g., 15-35 Angstroms). In one example, the first nitride film's thickness is 100 Angstroms and the one or more additional films have a thickness of 33 Angstroms. Although six layers are illustrated in FIG. 6, the number of layers may also be fewer or more than six (e.g., a single layer, 2, 3, 4, 5, 10, etc.).

Depositing and treating more layers to achieve the same film thickness can improve the quality and/or density of the resulting nitride barrier. Thus, a high-quality nitride barrier can be formed without damaging the underlying materials by depositing one or more nitride layers according to the processes described.

Figure 7:
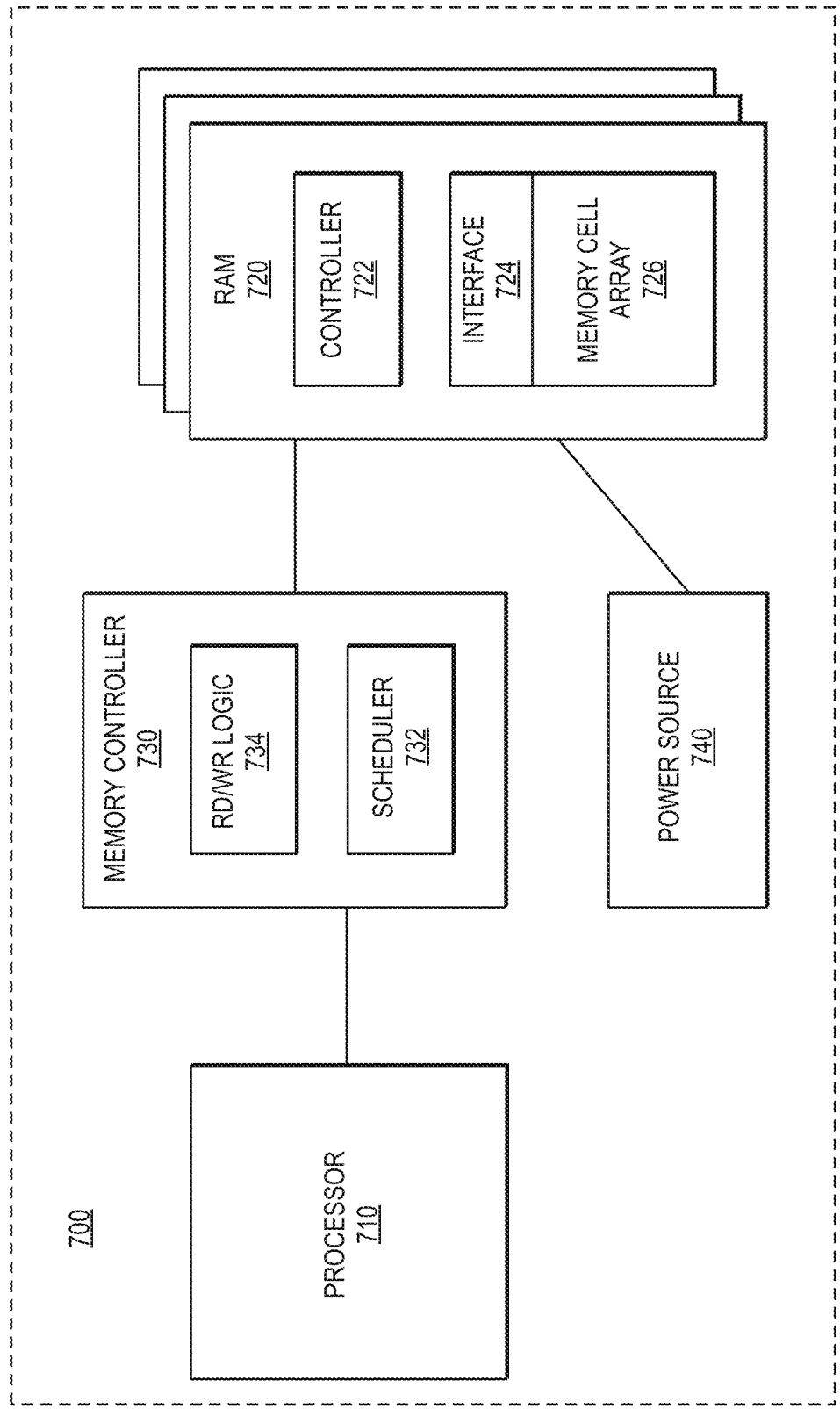
FIG. 7 is a block diagram of an example of a system that includes a memory cell array.

FIG. 7 is a block diagram of an example of a system that includes a memory array in which an oxidation barrier may be formed.

The system 700 includes components of a memory subsystem having random access memory (RAM) 720 to store and provide data in response to operations of the processor 710. The system 700 receives memory access requests from a host or a processor 710, which is processing logic that executes operations based on data stored in the RAM 720 or generates data to store in the RAM 720. The processor 710 can be or include a host processor, central processing unit (CPU), microcontroller or microprocessor, graphics processor, peripheral processor, application specific processor, or other processor, and can be single core or multicore.

The system 700 includes a memory controller 730, which represents logic to interface with the RAM 720 and manage access to data stored in the memory. In one example, the memory controller 730 is integrated into the hardware of the processor 710. In one example, the memory controller 730 is standalone hardware, separate from the processor 710. The memory controller 730 can be a separate circuit on a substrate that includes the processor. The memory controller 730 can be a separate die or chip integrated on a common substrate with a processor die (e.g., as a system on a chip (SoC)). In one example, the memory controller 730 is an integrated memory controller (iMC) integrated as a circuit on the processor die. In one example, at least some of the RAM 720 can be included on an SoC with the memory controller 730 and/or the processor 710.

In one example, the memory controller 730 includes read/write logic 734, which includes hardware to interface with the RAM 720. The logic 734 enables the memory controller 730 to generate read and write commands to service requests for data access generated by the execution of instructions by the processor 710. In one example, the memory controller 730 includes a scheduler 732 to schedule the sending of access commands to the RAM 720 based on known timing parameters for read and write access for the RAM 720. The RAM 720 can be a memory with an oxidation barrier formed with a low temperature plasma process, as described above.

The memory resources or cachelines in the RAM 720 are represented by memory cell array 726, which can include a 3D crosspoint array with the nitride barrier described herein. The RAM 720 includes an interface 724 (e.g., interface logic) to control the access to the memory cell array 726. The interface 724 can include decode logic, including logic to address specific rows or columns or bits of data. In one example, the interface 724 includes logic to control the amount of current provided to specific memory cells of the memory cell array 726. Thus, control over writing to the memory cell array 726 can occur through driver and/or other access logic of the interface 724. The controller 722 represents an on-die controller on the RAM 720 to control its internal operations to execute commands received from the memory controller 730. For example, the controller 722 can control any of timing, addressing, I/O (input/output) margining, scheduling, and error correction for the RAM 720.

In one embodiment, the controller 722 is configured to read and write to the memory cell array 726. In one example, the controller 722 can read a memory cell by applying a voltage via the interface 724 to the memory cell to determine and sense an electrical response of the cell to the applied voltage. In one such example, the memory cell is determined to be in one state if it conducts current above a threshold in response to the applied voltage, and in another state if the cell does not conduct current above the threshold in response to the applied voltage. The state of the memory cell may also be determined based on the polarity of the applied voltage.

In one example, when the controller 722 is to write to a memory cell, the controller 722 applies a voltage pulse with sufficiently high magnitude to the memory cell to program the memory cell. In one such example, the controller 722 applies a pulse that is higher than a threshold voltage (Vt), and thus sufficient to trigger the storage material to "threshold" or transition from one of the stable states to another stable state. As described above, a high quality nitride barrier formed at a low temperature can enable protecting the array materials during processing to keep the threshold voltage within the desired range. The system 700 includes a power source 740, which can be a voltage source or regulator that provides power to the RAM 720. The controller 722 and the interface 724 can use the power available from the power source 740 to apply a voltage drop to access a memory cell of the array 726.

Figure 8:
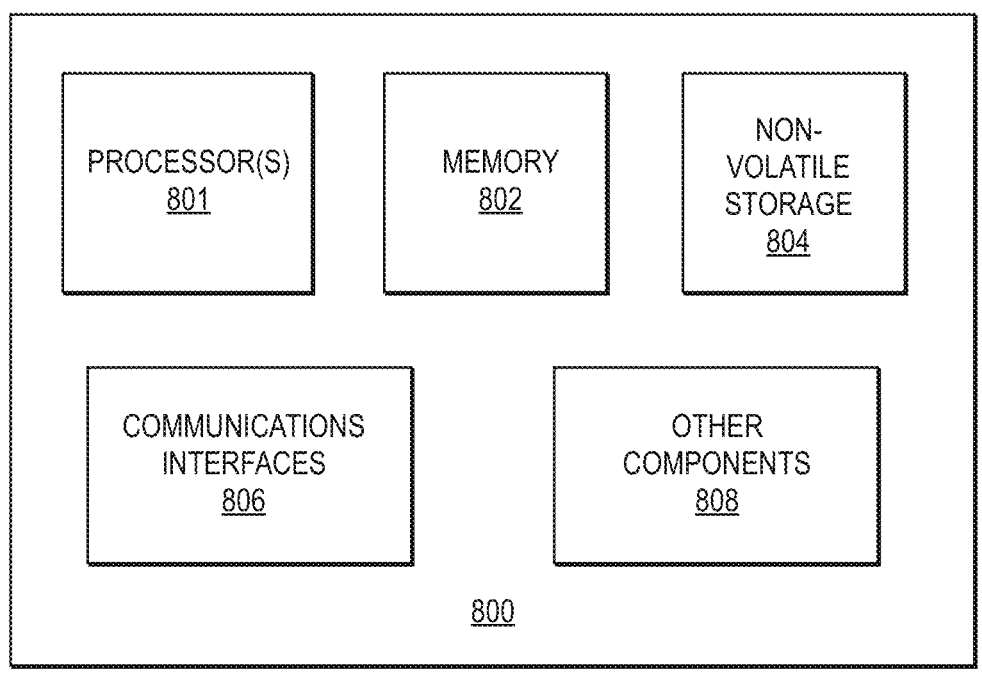
FIG. 8 provides an exemplary depiction of a computing system in which a memory device with an oxidation barrier described herein can be implemented.

FIG. 8 provides an exemplary depiction of a computing system 800 (e.g., a smartphone, a tablet computer, a laptop computer, a desktop computer, a server computer, etc.). As observed in FIG. 8, the system 800 may include one or more processors or processing units 801. The processor(s) 801 may include one or more central processing units (CPUs), each of which may include, e.g., a plurality of general-purpose processing cores. The processor(s) 801 may also or alternatively include one or more graphics processing units (GPUs) or other processing units. The processor(s) 801 may include memory management logic (e.g., a memory controller) and I/O control logic. The processor(s) 801 can be similar to, or the same as, the processor 710 of FIG. 7.

The system 800 also includes memory 802 (e.g., system memory), non-volatile storage 804, communications interfaces 806, and other components 808. The other components may include, for example, a display (e.g., touchscreen, flat-panel), a power supply (e.g., a battery or/or other power supply), sensors, power management logic, or other components. The communications interfaces 806 may include logic and/or features to support a communication interface. For these examples, communications interface 806 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more standards promulgated by IEEE. For example, one such Ethernet standard may include IEEE 802.3. Network communication may also occur according to one or more OpenFlow specifications such as the OpenFlow Switch Specification. Other examples of communications interfaces includes, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 804, which may be the mass storage component of the system. The non-volatile storage 804 can be similar to, or the same as, the RAM 720 of FIG. 7, described above. The non-volatile storage 804 includes one or more non-volatile memory (storage) arrays. The non-volatile storage 804 can include a solid state drive (SSD), a dual in-line memory module (DIMM), or other non-volatile storage. Non-volatile storage 804 may include byte or block addressable types of non-volatile memory having a 3-dimensional (3D) cross-point memory structure that includes chalcogenide material and/or phase change material hereinafter referred to as "3D cross-point memory". Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), Conductive Bridging RAM (CBRAM), or a combination of any of the above.

Thus, a nitride layer that acts as a good oxidation and moisture barrier or isolator may be formed at a low temperature. Such a film may be suitable for sealing areas exposed by etching with sensitive chalcogenide materials or other materials sensitive to cross contamination either through immediate exposure or through post diffusion risks in the processing flow. The resulting barrier properties is a good barrier to steam and can prevent oxidative deposition chemistries from physically damaging the cell.

Examples including dielectric barriers for non-volatile memory devices follow. In one example, a non-volatile memory die includes multiple tiles of memory cells, each of the multiple tiles including a plurality of non-volatile memory cells, each of the non-volatile memory cells including a stack of materials including chalcogenide material, an oxidation barrier on a side wall of a trench between adjacent memory tiles, and a dielectric fill in the trench and over the oxidation barrier. In one example, the oxidation barrier includes or is a silicon nitride film. In one example, the silicon nitride film has a density that is greater than 2.6 g/cm3. In one example, the oxidation barrier has a thickness in a range between 15-500 Angstroms. In one example, the oxidation barrier comprises multiple nitride films. In one example, the multiple nitride films include a first nitride film and one or more second nitride films over the first nitride film, wherein the first nitride film is thicker than the one or more second nitride films. In one example, the trench between adjacent memory tiles includes tapered side walls. In one example, the oxidation barrier comprises a conformal layer over the tapered side walls of the trench. In one example, the oxidation barrier is disposed on a bottom of the trench. In one example, the trench comprises a wide trench that is wider than it is deep. In one example, the oxidation barrier is on a chalcogenide material exposed at the side wall of the trench. In one example, the oxidation barrier is on a carbon layer exposed at the side wall of the trench.

In one example, a non-volatile memory device includes multiple tiers of memory tiles, the multiple tiers vertically stacked over one another, each of the memory tiles including a plurality of memory cells, each of the plurality of memory cells including a layer of chalcogenide material between a first conductive access line and a second conductive access line and an oxidation barrier on a side wall of a trench between adjacent memory tiles. In one example, a non-volatile memory device includes multiple tiers of memory tiles, the multiple tiers vertically stacked over one another, each of the memory tiles including a plurality of memory cell, a trench through the multiple tiers between a pair of adjacent memory tiles, and a silicon nitride film on a side wall of the trench between adjacent memory tiles.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A non-volatile memory die comprising:
   multiple tiles of memory cells, each of the multiple tiles including a plurality of non-volatile memory cells, each of the non-volatile memory cells including a stack of materials including chalcogenide material;
   an oxidation barrier on a side wall of a trench between adjacent memory tiles, wherein the trench between adjacent memory tiles includes tapered side walls; and
   a dielectric fill in the trench and over the oxidation barrier.

2. The non-volatile memory die of claim 1, wherein:
the oxidation barrier comprises a silicon nitride film.

3. The non-volatile memory die of claim 2, wherein:
the silicon nitride film has a density that is greater than 2.6 g/cm3.

4. The non-volatile memory die of claim 1, wherein:
the oxidation barrier has a thickness in a range between 15-500 Angstroms.

5. The non-volatile memory die of claim 1, wherein:
the oxidation barrier comprises multiple nitride films.

6. The non-volatile memory die of claim 5, wherein:
the multiple nitride films include:
a first nitride film and one or more second nitride films over the first nitride film, wherein the first nitride film is thicker than the one or more second nitride films.

7. The non-volatile memory die of claim 1, wherein:
the oxidation barrier comprises a conformal layer over the tapered side walls of the trench.

8. The non-volatile memory die of claim 1, wherein:
the oxidation barrier is further disposed on a bottom of the trench.

9. The non-volatile memory die of claim 1, wherein:
the oxidation barrier is on a chalcogenide material exposed at the side wall of the trench.

10. The non-volatile memory die of claim 1, wherein:
the oxidation barrier is on a carbon layer exposed at the side wall of the trench.

11. A non-volatile memory die comprising:
multiple tiles of memory cells, each of the multiple tiles including a plurality of non-volatile memory cells, each of the non-volatile memory cells including a stack of materials including chalcogenide material;
an oxidation barrier on a side wall and on a bottom of a trench between adjacent memory tiles;
the trench between adjacent memory tiles includes tapered side walls; and
a dielectric fill in the trench and over the oxidation barrier.

12. The non-volatile memory die of claim 11, wherein:
the oxidation barrier comprises a silicon nitride film.

13. The non-volatile memory die of claim 12, wherein:
the silicon nitride film has a density that is greater than 2.6 g/cm3.

14. The non-volatile memory die of claim 11, wherein:
the oxidation barrier has a thickness in a range between 15-500 Angstroms.

15. The non-volatile memory die of claim 11, wherein:
the oxidation barrier comprises multiple nitride films.

16. The non-volatile memory die of claim 15, wherein:
the multiple nitride films include:
a first nitride film and one or more second nitride films over the first nitride film, wherein the first nitride film is thicker than the one or more second nitride films.

17. The non-volatile memory die of claim 11, wherein:
the trench between adjacent memory tiles includes tapered side walls.

18. The non-volatile memory die of claim 17, wherein:
the oxidation barrier comprises a conformal layer over the tapered side walls of the trench.

19. The non-volatile memory die of claim 11, wherein:
the oxidation barrier is on a chalcogenide material exposed at the side wall of the trench.

20. The non-volatile memory die of claim 11, wherein:
the oxidation barrier is on a carbon layer exposed at the side wall of the trench.

\* \* \* \* \*